United States Patent
Yang

(10) Patent No.: US 9,490,021 B2
(45) Date of Patent: Nov. 8, 2016

(54) SEMICONDUCTOR DEVICE

(71) Applicant: SK hynix Inc., Icheon-si Gyeonggi-do (KR)

(72) Inventor: Jae Wook Yang, Cheongju-si (KR)

(73) Assignee: SK HYNIX INC., Icheon-Si (KR)

( * ) Notice: Subject to any disclaimer, the term of this patent is extended or adjusted under 35 U.S.C. 154(b) by 122 days.

(21) Appl. No.: 14/620,493

(22) Filed: Feb. 12, 2015

(65) Prior Publication Data

US 2016/0104538 A1   Apr. 14, 2016

(51) Int. Cl.
*G11C 16/16* (2006.01)
*G06F 12/02* (2006.01)
*G11C 16/04* (2006.01)
*G11C 16/14* (2006.01)

(52) U.S. Cl.
CPC ........... *G11C 16/16* (2013.01); *G06F 12/0246* (2013.01); *G11C 16/0483* (2013.01); *G06F 2212/7201* (2013.01); *G11C 16/0466* (2013.01); *G11C 16/14* (2013.01)

(58) Field of Classification Search
CPC .............. G11C 16/16; G11C 16/0466; G11C 16/0483

USPC ............ 365/185.17, 185.18, 185.23, 185.25, 365/185.29
See application file for complete search history.

(56) References Cited

U.S. PATENT DOCUMENTS 8,873,301 B2 * 10/2014 Kwon .................... G11C 16/16 365/185.25

FOREIGN PATENT DOCUMENTS

KR   1020120034828 A   4/2012
KR   1020130101307 A   9/2013

* cited by examiner

*Primary Examiner* — Tan T. Nguyen
(74) *Attorney, Agent, or Firm* — William Park & Associates Ltd.

(57) ABSTRACT

The semiconductor device may include a memory block including a memory string electrically coupled between a bit line and a common source line, the memory string including source select transistors and memory cells configured to operate in response to operating voltages applied to select lines and word lines coupled to the memory cells and the source select transistors. The semiconductor device may include an operation circuit configured to apply a source voltage to the common source line for an erase operation, and to control floating states of the select lines and the word lines. The operation circuit may be configured to set the select lines to a floating state after the source voltage starts to increase from a precharge level to an erase level.

18 Claims, 9 Drawing Sheets

SEMICONDUCTOR DEVICE

CROSS-REFERENCE TO RELATED APPLICATION

The present application claims priority to Korean patent application number 10-2014-0138345 filed on Oct. 14, 2014, in the Korean Intellectual Property Office, the entire disclosure of which is incorporated by reference herein.

BACKGROUND

1. Technical Field

The present application generally relates to a semiconductor device. More specifically, the present application relates to a semiconductor device including a memory cell.

2. Related Art

A flash memory device having a 3-dimensional structure including a vertical channel applies a ground voltage to word lines to perform an erase operation of a memory cell, and select lines and dummy word lines maintain floating states. When a pipe gate line is added, the pipe gate line also maintains a floating state. When a high erase voltage is applied to the vertical channel, voltages of the select lines and the dummy word lines in a floating state are increased by a capacitor coupling phenomenon, and a vertical electric field is formed. Thus, electrons are trapped in a charge trap layer of the memory cell.

Since the voltage of the select line is highly increased and is increased more, a threshold voltage may be abnormally increased. As a result, an error may be generated.

BRIEF SUMMARY

According to an embodiment, a semiconductor device may include a memory block including a memory string electrically coupled between a bit line and a common source line, the memory string including source select transistors and memory cells configured to operate in response to operating voltages applied to select lines and word lines coupled to the memory cells and the source select transistors. The semiconductor device may include an operation circuit configured to apply a source voltage to the common source line for an erase operation, and to control floating states of the select lines and the word lines. The operation circuit may be configured to set the select lines to a floating state after the source voltage starts to increase from a precharge level to an erase level.

According to an embodiment, a computing system may include a central processing unit, an interface, and a memory system coupled with one another through a bus. The memory system may include a memory controller coupled to a flash memory. The flash memory may include a memory block including a memory string electrically coupled between a bit line and a common source line. The memory string may include source select transistors and memory cells configured to operate in response to operating voltages applied to select lines and word lines coupled to the memory cells and the source select transistors. The flash memory may include an operation circuit configured to apply a source voltage to the common source line for an erase operation, and to control floating states of the select lines and the word lines. The operation circuit may be configured to set the select lines to a floating state after the source voltage starts to increase from a precharge level to an erase level.

DETAILED DESCRIPTION

Figure 1:
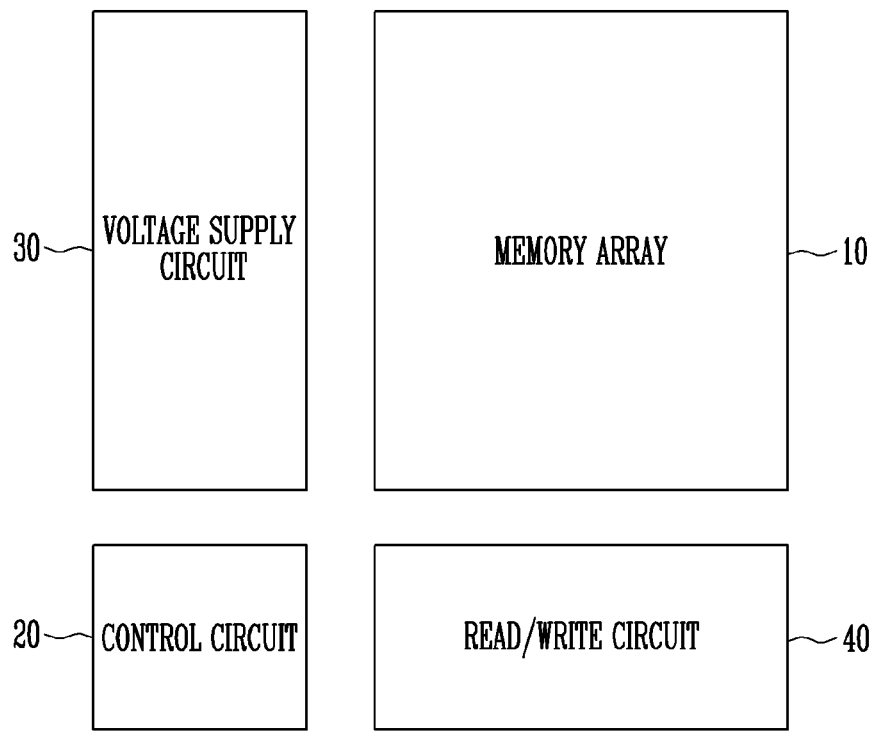
FIG. 1 is a block diagram illustrating a representation of a semiconductor device according to an embodiment.

In the drawings, the thicknesses of layers and regions are expressed for convenience of the explanation, and may be exaggerated with respect to an actual physical thickness. In the explanation of the present application, a well known structure, which is not related to the scope of the present application, may be omitted. In numbering reference numerals to the structural parts of each drawing, like numerals may refer to like elements throughout the description of the figures although the reference numerals are displayed in different drawings.

Various embodiments of the present application may relate to a semiconductor device capable of improving reliability.

FIG. 1 is a block diagram illustrating a representation of a semiconductor device according to an embodiment.

Referring to FIG. 1, the semiconductor device may include a memory array 10 and operation circuits 20 to 40. The operation circuits may include a control circuit 20, a voltage supply circuit 30, and a read/write circuit 40. The memory array 10 may include a plurality of memory blocks (not illustrated). Each of the memory blocks may include a plurality of memory strings (not illustrated). Each of the memory strings may include a plurality of memory cells (not illustrated). In a flash memory device, a memory block may include flash memory cells. For example, the memory block may include flash memory cells including polysilicon used in a floating gate or a charge trap layer of a charge trap device.

In particular, the memory block may include memory strings connected to bit lines (not illustrated), respectively, and connected to a common source line (not illustrated) in parallel. The memory strings may be formed on a semiconductor substrate in a 2-dimensional structure or a 3-dimensional structure. A memory block having the memory string of the 3-dimensional structure will be explained below.

Figure 2A:
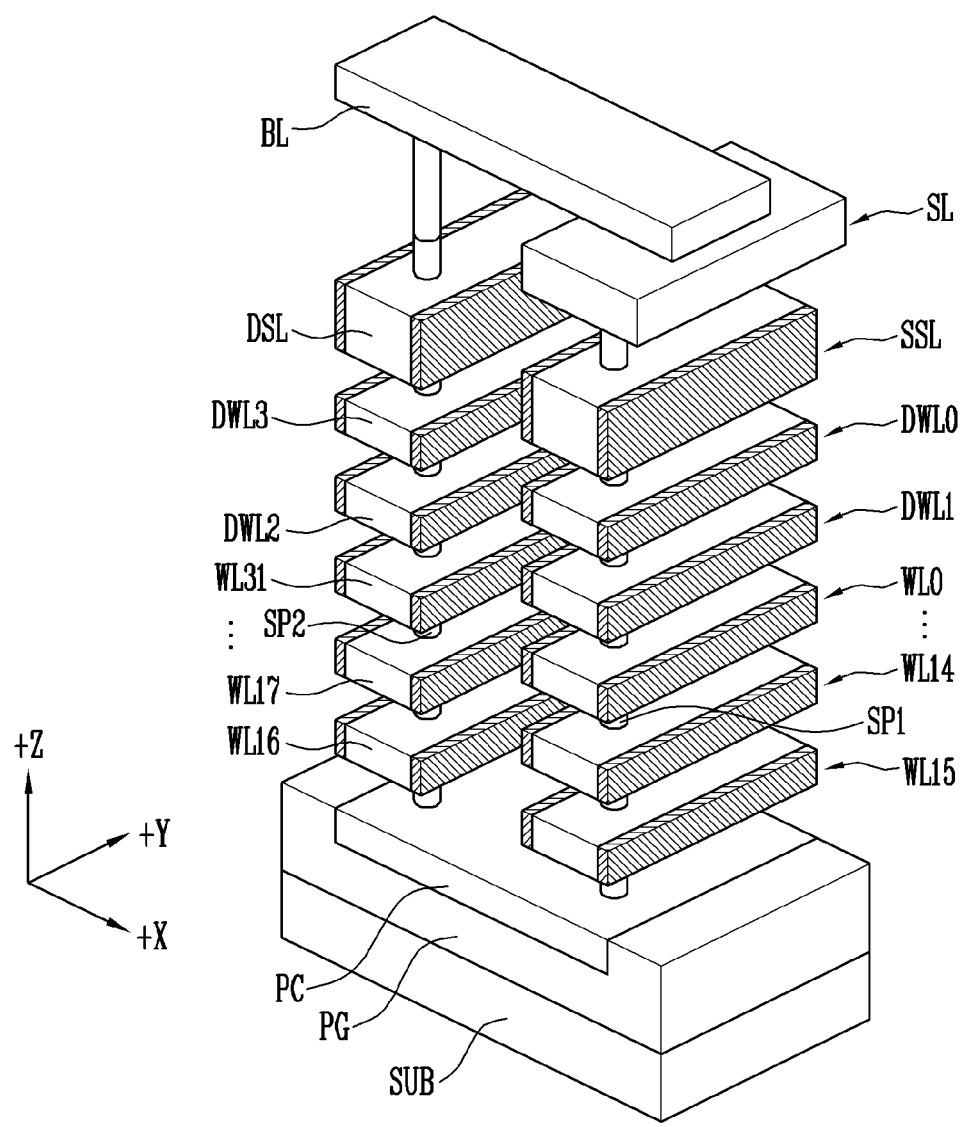
FIGS. 2A and 2B are views illustrating a representation of a memory string according to an embodiment.
Figure 2B:
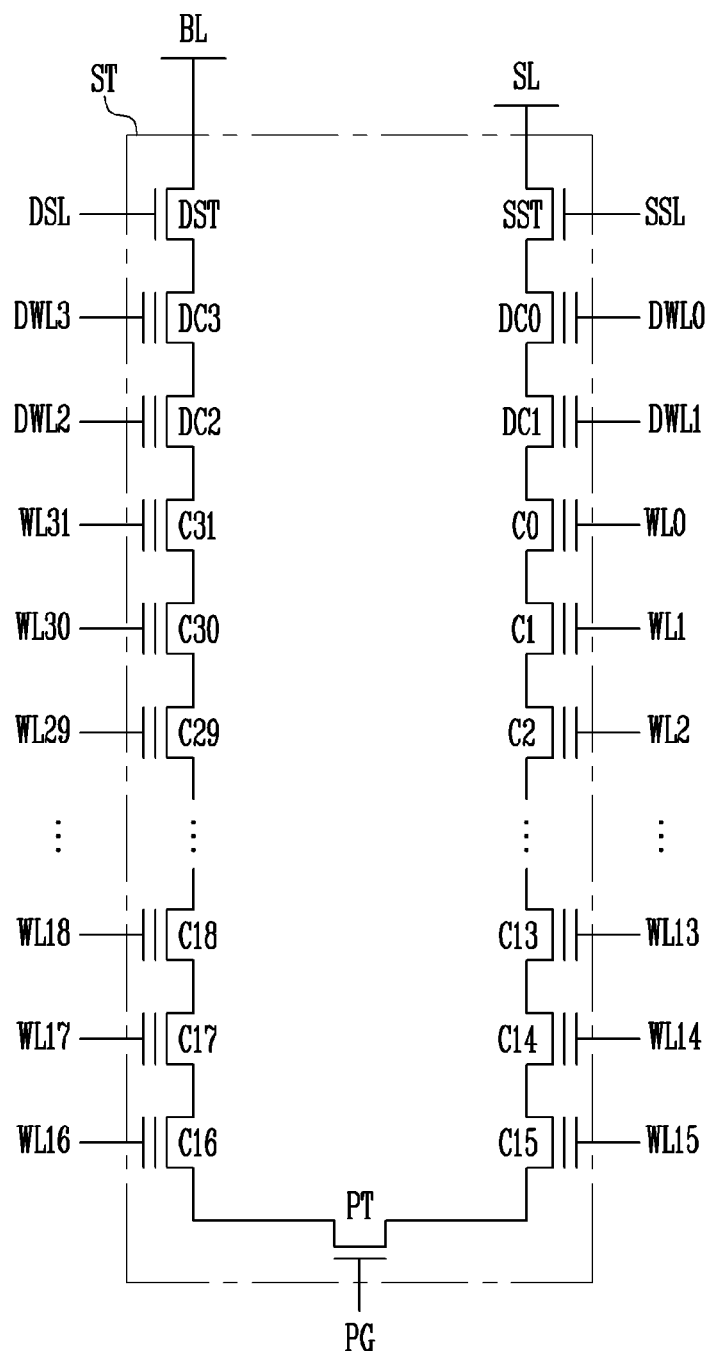

FIGS. 2A and 2B are views illustrating a representation of a memory string according to an embodiment.

Referring to FIGS. 2A and 2B, a pipe gate PG including a recessed part may be formed on a semiconductor substrate SUB. A pipe channel layer PC may be formed in the recessed part of the pipe gate PG. A plurality of vertical channel layers SP1 and SP2 are formed on the pipe channel layer PC. An upper portion of the first vertical channel layer SP1 among the pair of the vertical channel layers SP1 and SP2 may be coupled or connected to a common source line SL, and an upper portion of the second vertical channel layer SP2 may be coupled or connected to a bit line BL. The vertical channel layers SP1 and SP2 may be formed of polysilicon.

A plurality of conductive layers DSL, DWL3, DWL2, and WL31 to WL16 are formed to surround or substantially surround the second vertical channel layer SP2 at different heights of the second vertical channel layer SP2. Also, a plurality of conductive layers SSL, DWL0, DWL1, and WL0 to WL15 are formed to surround or substantially surround the first vertical channel layer SP1 at different heights of the first vertical channel layer SP1. A multi-layered layer (not illustrated) including a charge trap layer is formed on a surface of the vertical channel layers SP1 and SP2 and a surface of the pipe channel layer PC, and a multi-layered layer is also interposed between the vertical channel layers SP1 and SP2 and the conductive layers DSL, DWL3, DWL2, WL31 to WL16, SSL, DWL0, DWL1, and WL0 to WL15 and between the pipe channel layer PC and the pipe gate PG.

The uppermost conductive layer surrounding the second vertical channel layer SP2 may become a drain select line DSL, and the conductive layers lower than the drain select line DSL may become word lines DWL3, DWL2, and WL31 to WL16. The word lines under the drain select line DSL may include dummy word lines DWL3 and DWL2 and main word lines WL31 to WL16. The uppermost conductive layer which surrounds the first vertical channel layer SP1 may become a source select line SSL, and the conductive layers lower than the source select line SSL may become word lines DWL0, DWL1, and WL0 to WL15. The word lines under the source select line SSL may include dummy word lines DWL0 and DWL1 and main word lines WL0 to WL15.

The first conductive layers SSL, DWL0, DWL1, and WL0 to WL15 and the second conductive layers DSL, DWL3, DWL2, and WL31 to WL16 each may be stacked on different areas of the semiconductor substrate. The first vertical channel layer SP1 passing through the first conductive layers SSL, DWL0, DWL1, and WL0 to WL15 is vertically connected or vertically coupled between the common source line SL and the pipe channel layer PC. The second vertical channel layer SP2 passing through the second conductive layers DSL, DWL3, DWL2, and WL16 to WL31 is vertically connected or vertically coupled between the bit line BL and the pipe channel layer PC.

A drain select transistor DST may be formed at a portion in which the drain select line DSL surrounds the second vertical channel layer SP2. Dummy memory cells DC3 and DC2 and main memory cells C31 to C16 each are formed at portions in which the word lines DWL3, DWL2, and WL31 to WL16 surround the second vertical channel layer SP2. A source select transistor SST may be formed at a portion in which the source select line SSL surrounds the first vertical channel layer SP1. Dummy memory cells DC0 and DC1 and main memory cells C0 to C15 each are formed at portions in which the dummy word lines DWL0 and DWL1 and the word lines WL0 to WL15 surround the first vertical channel layer SP1.

According to the above-mentioned structure, the memory string ST may include the drain select transistor DST, the dummy memory cells DC3 and DC2, and the main memory cells C31 to C16, which are vertically connected between the bit line BL and the pipe channel layer PC, and the source select transistor SST, the dummy memory cells DC0 and DC1, and the main memory cells C0 to C15, which are vertically connected between the common source line CSL and the pipe channel layer PC.

The above examples in which four dummy word lines DWL0 to DWL3 and thirty two main word lines WL0 to WL31 are formed has been described, however, the number of the dummy word lines and the number of the main word lines may be changed.

Figure 3A:
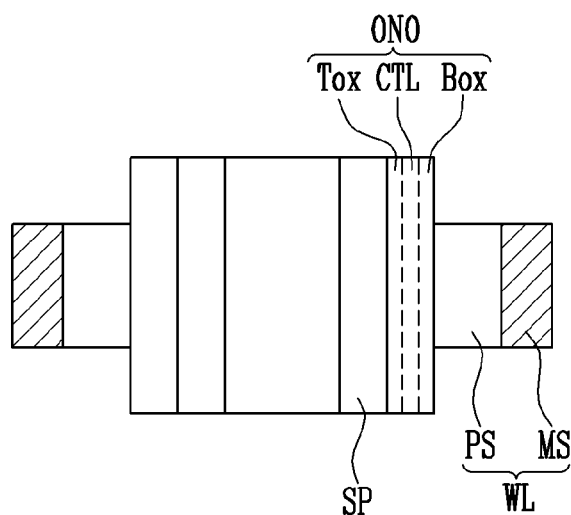
FIGS. 3A and 3B are views illustrating a plan view and a cross-sectional view of a representation of a memory cell according to an embodiment.
Figure 3B:
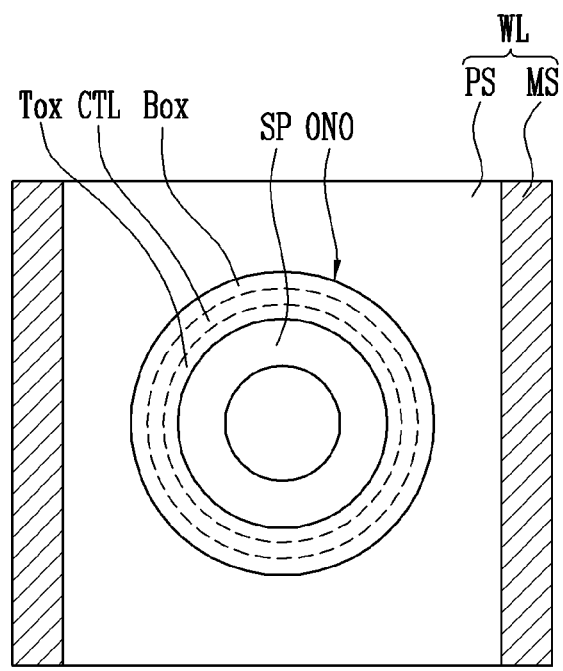

FIGS. 3A and 3B are views illustrating a plan view and a cross-sectional view of a representation of a memory cell according to an embodiment.

Referring to FIGS. 3A and 3B, a pipe channel layer SP may be formed in a hollow cylindrical shape or substantially a hollow cylindrical shape. The pipe channel layer SP may be formed of a semiconductor layer. In particular, the pipe channel layer SP may be formed of a polysilicon layer doped with impurities having a concentration at which conductivity is not generated or a polysilicon layer undoped with impurities. A stacked layer ONO including a charge trap layer CTL may be formed to surround the pipe channel layer SP. The stacked layer ONO may be formed in a stacked structure including a tunnel insulating layer Tox, the charge trap layer CTL, and a blocking insulating layer Box. The stacked layer ONO may be formed in a stacked structure including a structure further including an insulating layer. The tunnel insulating layer Tox may be formed of an oxide layer, the charge trap layer CTL may be formed of a nitride layer, and the blocking insulating layer Box may be formed of an oxide layer or a high dielectric insulating layer having a permittivity higher than the nitride layer. The tunnel insulating layer Tox is interposed between the charge trap layer CTL and the pipe channel layer SP. Conductive layers may be formed to surround the pipe channel layer SP at different heights. For example, a conductive layer used for the word line WL may be formed of a polysilicon layer PS, and an outer surface of the conductive layer may be formed of a metal silicide MS. The stacked layer ONO is interposed between the pipe channel layer SP and the word line WL.

Figure 4:
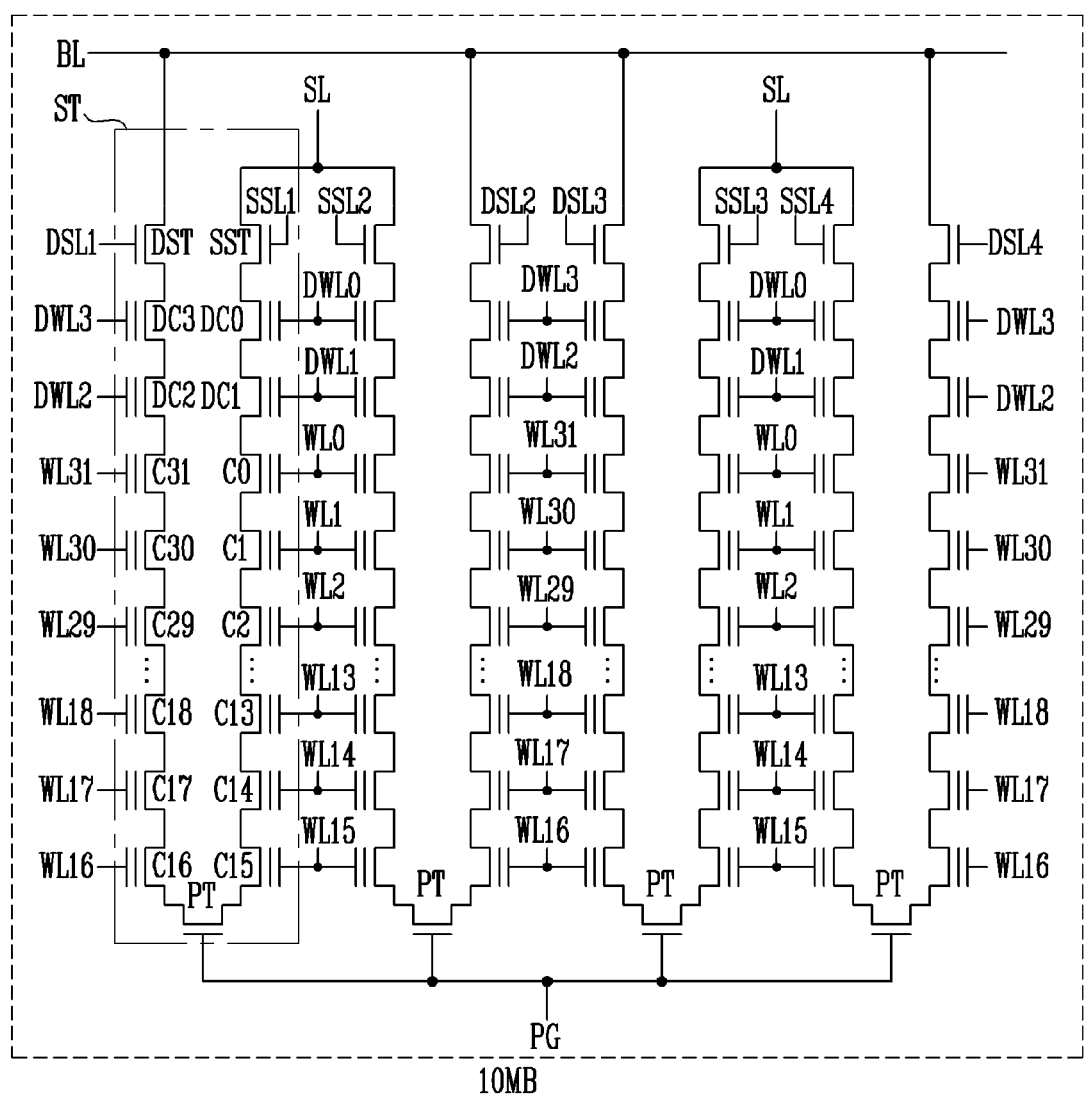
FIG. 4 is a view illustrating a representation of a memory block according to an embodiment.

FIG. 4 is a view illustrating a representation of a memory block according to an embodiment.

Referring to FIG. 4, the memory block 10MB may include a plurality of memory strings ST connected to bit lines. In a Pipe-BiCS structure, each of the memory strings ST include a first vertical memory string SST, DC0, DC1, and C0 to C15 vertically connected between the common source line SL and the pipe transistor PT of a substrate, and a second vertical memory string DST, DC3, DC2, and C16 and C31 vertically connected between the bit line BL and the pipe transistor PT of the substrate. The first vertical memory string SST, DC0, DC1, and C0 to C15 includes a source select transistor SST, dummy memory cells DC0 and DC1, and main memory cells C0 to C15. The source select transistor SST is controlled by a voltage applied to the source select line SSL1, and the dummy memory cells DC0 and DC1 and the main memory cells C0 to C15 are controlled by voltages applied to the dummy word lines DWL3 and DWL2 and the main word lines WL0 to WL15 which are stacked. The second vertical memory string DST, DC3, DC2, and C16 to C31 includes a drain select transistor DST, dummy memory cells DC3 and DC2, and main memory cells C31 to C16. The drain select transistor DST is controlled by a voltage applied to the drain select line DSL1, and the dummy memory cells DC3 and DC2 and the main memory cells C31 to C16 are controlled by voltages applied to the dummy word lines DWL3 and DWL2 and the main word lines WL31 to WL16 which are stacked.

When the memory block 10MB is selected, the pipe transistor PT connected between a pair of main memory cells C15 and C16 disposed at a center of the memory string in the P-BiCs structure performs an operation electrically connecting the channel layers of the first vertical memory string SST, DC0, DC1, and C0 to C15 included in the selected memory block 10MB to the channel layers of the second vertical memory string DST, DC3, DC2, and C16 to C31.

In a memory block with the 2-dimensional structure, one memory string is connected to every bit line and the drain select transistors of the memory block are simultaneously controlled by one drain select line. However, in the memory block 10MB with the 3-dimensional structure, a plurality of the memory strings ST are commonly connected to each bit line BL. In the same memory block 10MB, the number of the memory strings ST, which are commonly connected to one bit line BL and controlled by the same word lines, may be changed based on a design.

As the plurality of memory strings are connected to one bit line BL in parallel, the drain select transistors DST are independently controlled by select voltages applied to the drain select lines DSL1 to DSL4 so as to selectively connect one bit line BL to the memory strings ST.

The dummy memory cells DC0 and DC1 and the main memory cells C0 to C15 of the first vertical memory string SST, DC0, DC1, and C0 to C15, and the dummy memory cells DC3 and DC2 and the main memory cells C31 to C16 of the second vertical memory string DST, DC3, DC2, and C16 to C31, vertically connected in the memory block 10MB, are each controlled by operating voltages applied to the stacked dummy word lines DWL0 to DWL4 and the stacked main word lines WL0 to WL31, respectively. The above word lines WL0 to WL31 are classified in a memory block unit.

The select lines DSL0 to DSL4 and SSL0 to SSL4 and the word lines DWL0 to DWL3 and WL0 to WL31 become the local lines of the memory block 10MB. In particular, the source select lines SSL0 to SSL4 and the word lines DWL0, DWL1, and WL0 to WL15 may become local lines of the first vertical memory string. The drain select lines DSL0 to DSL4 and the word lines DWL2, DWL3, and WL31 to WL16 may become local lines of the second vertical memory string. Gates PG of the pipe transistors PT may be commonly connected in the memory block 10MB.

Referring again to FIGS. 1 and 2B, the operation circuits 20 to 40 are configured to perform a program loop, an erase loop, and a read operation of memory cells (for example, C0) connected to the selected word line (for example, WL0). The program loop may include a program operation and a verification operation, and the erase loop may include an erase operation and a verification operation. The operation circuits 20 to 40 may perform a program operation (or a post-program operation) configured to adjust an erase level, in which threshold voltages of the memory cells are distributed, after the erase loop.

In order to perform the program loop, the erase loop, and the read operation, the operation circuits 20 to 40 may be configured to selectively output the operating voltages to the local lines SSL, DLW0 to DWL3, WL0 to WL31, PG, and DSL and the common source line SL of the selected memory block, and control precharge/discharge of the bit lines BL or sense a current flow (or a voltage variation) of the bit lines BL.

In a NAND flash memory device, the operation circuits include a control circuit 20, a voltage supply circuit 30, and a read/write circuit 40. Each of the above circuits will be explained below.

The control circuit 20 controls the voltage supply circuit 30 to generate operating voltages. The operating voltages are used to perform the program loop, the erase loop, and the read operation in response to a command signal input from the outside and received by the voltage supply circuit. The operating voltages used to perform the program loop, the erase loop, and the read operation are at desired levels and the operating voltages may be applied to the local lines SSL, DLW0 to DWL3, WL0 to WL31, PG, and DSL and the common source line SL of the selected memory block. The control circuit 20 controls the read/write circuit 40 to control precharge/discharge of the bit lines BL based on data to be stored in the memory cells to perform the program loop, the erase loop, and the read operation, or sense a current flow (or a voltage variation) of the bit lines BL during the read operation or verification operation.

The voltage supply circuit 30 generates the operating voltages required in the program loop, the erase loop, and the read operation of the memory cells. The voltage supply circuit 30 generates the operating voltages required in the program loop, the erase loop, and the read operation of the memory cells based on the control of the control circuit 20. Here, the operating voltages may include, for example but not limited to, a program voltage, a read voltage, the erase voltage, a pass voltage, the select voltage, the common source voltage, and/or the like. Also, the voltage supply circuit 30 may output the operating voltages to the local lines SSL, DLW0 to DWL3, WL0 to WL31, PG, and DSL and the common source line SL of the selected memory block in response to a row address signal of the control circuit 20.

The read/write circuit 40 may include a plurality of page buffers (not illustrated) respectively connected to the memory array 10 through the bit lines BL. In particular, the page buffers may be connected to the bit lines BL, respectively. That is, one page buffer may be connected to one bit line. In the program operation, the page buffers selectively precharge the bit lines BL based on a control signal of the control circuit 20 and data to be stored in the memory cells. In the program verification operation or the read operation, based on the control of the control circuit 20, the read/write circuit 40 precharges the bit lines BL, and then senses the voltage variation or a current of the bit lines BL and latches data read from the memory cell.

Figure 5:
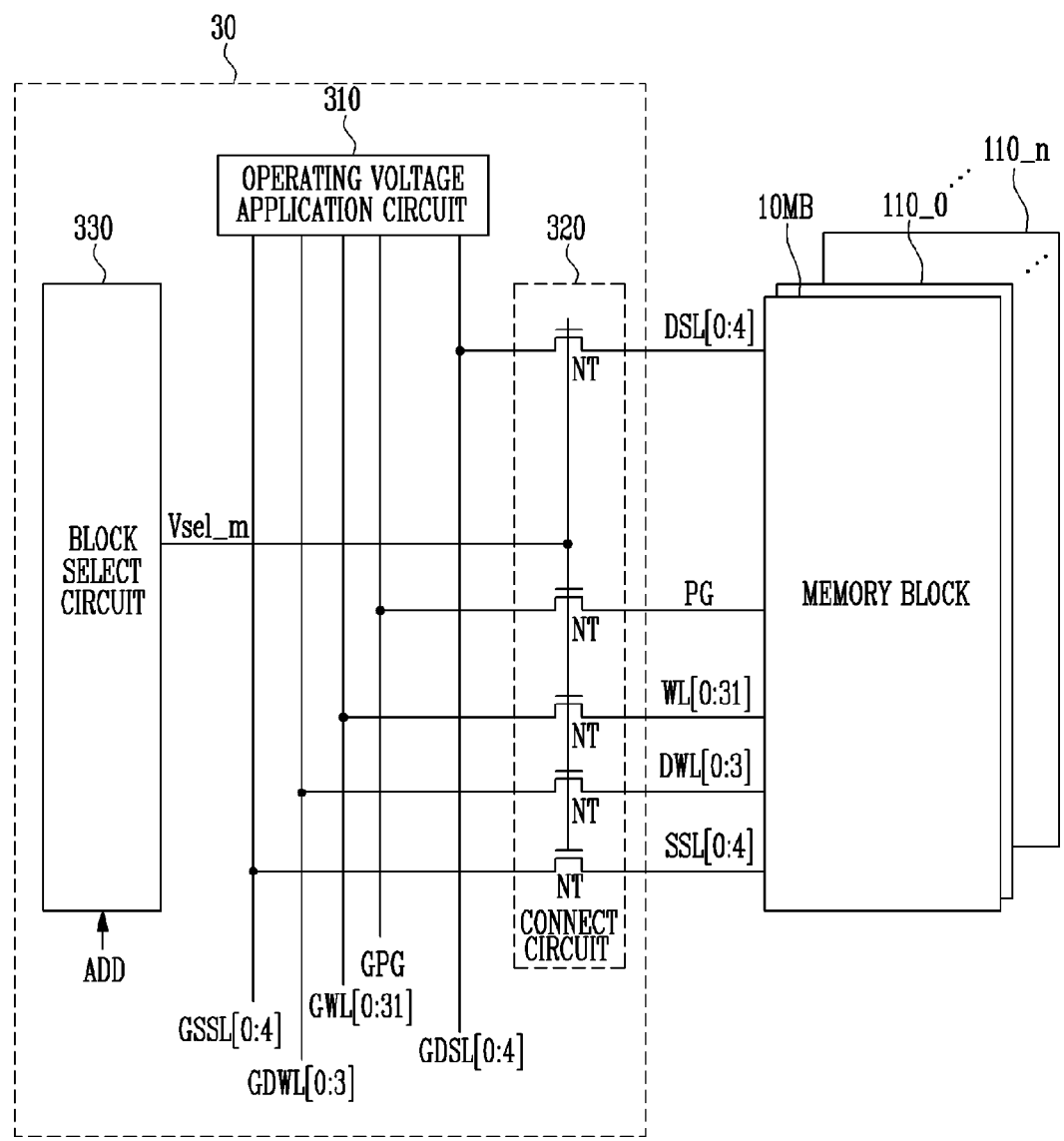
FIG. 5 is a block diagram illustrating a representation of a power supply circuit according to an embodiment.

FIG. 5 is a block diagram illustrating a representation of a power supply circuit according to an embodiment.

Referring to FIG. 5, the voltage supply circuit of the semiconductor device may include an operating voltage application circuit 310, a connect circuit 320, and a block select circuit 330.

The operating voltage application circuit 310 may be configured to output operating voltages to global lines GSSL[0:4], GDWL0 to GDWL3, GWL0 to GWL31, GPG, and GDSL[0:4]. For example, the operating voltage application circuit 310 outputs operating voltages required for the program operation, the read operation, and the erase operation of the memory cells to the global lines GSSL[0:4], GDWL0 to GDWL3, GWL0 to GWL31, GPG, and GDSL[0:4]. The operating voltage application circuit 310 applies the erase voltage to the common source line SL, which is required for the erase operation of the memory cells, and controls a floating state of the global lines GSSL[0:4], GDWL0 to GDWL3, GWL0 to GWL31, GPG, and GDSL[0:4].

The connect circuit 320 is connected between the global lines GSSL[0:4], GDWL0 to GDWL3, GWL0 to GWL31, GPG, and GDSL[0:4] and the local lines SSL[0:4], DWL0~DWL3, WL0~WL31, PG, DSL[0:4] of memory blocks 110_0 to 110_m, and operates in response to block select signals Vsel_m of the block select circuit 330. That is, in order to transmit the operating voltages (for example, the program voltage, the erase voltage, the read voltage, the pass voltage, the pipe gate voltage, the verification voltage, and/or the like), which are output from the operating voltage application circuit 310 to the global lines GSSL[0:4], GDWL0 to GDWL3, GWL0 to GWL31, GPG, and GDSL[0:4], to the local lines SSL[0:4], DWL0 to DWL3, WL0 to WL31, PG, and DSL[0:4] of the selected memory block 10MB, the connect circuit 320 performs an operation selectively connecting the global lines GSSL[0:4], GDWL0 to GDWL3, GWL0 to GWL31, GPG, and GDSL[0:4] to the local lines SSL[0:4], DWL0 to DWL3, WL0 to WL31, PG, and DSL[0:4] of the selected memory block 10MB in response to the block select signals Vsel_m of the block select circuit 330.

The connect circuit 320 may include transistors NT each connected between the global lines GSSL[0:4], GDWL0 to GDWL3, GWL0 to GWL31, GPG, and GDSL[0:4] and the local lines SSL[0:4], DWL0 to DWL3, WL0 to WL31, PG, and DSL[0:4] of the memory block. The operating voltages having high levels are applied to drains of the transistors NT, and one block select signal among the block select signals Vsel_m of the block select circuit 330 is applied to gates of the transistors NT.

In a flash memory device, the connect circuit 320 may be included in each of the memory blocks 10MB (110_0 to 110_m), and the connect circuit 320 may be selectively operated in response to the block select signal Vsel_m of the block select circuit 330. For example, the connect circuit 320 of the selected memory block 10MB, which is selected by the block select signal Vsel_m of the block select circuit 330, may be only selectively operated.

The block select circuit 330 may output the block select signal Vsel_m to the connect circuit 320 in response to the address signal ADD. The block select signal Vsel_m may be activated or deactivated in response to the address signal ADD. When the activated block select signal Vsel_m is input, the connect circuit 320 connects the global lines GSSL[0:4], GDWL0 to GDWL3, GWL0 to GWL31, GPG, and GDSL[0:4] to the local lines SSL[0:4], DWL0 to DWL3, WL0 to WL31, PG, and DSL[0:4] of the selected memory block 10MB. When the deactivated block select signal Vsel_m is input, the connect circuit 320 blocks the global lines GSSL[0:4], GDWL0 to GDWL3, GWL0 to GWL31, GPG, and GDSL[0:4] from being connected to the local lines SSL[0:4], DWL0 to DWL3, WL0 to WL31, PG, and DSL[0:4] of the non-selected memory block 10MB.

In order to transmit the operating voltages of the global lines GSSL[0:4], GDWL0 to GDWL3, GWL0 to GWL31, GPG, and GDSL[0:4] to the local lines SSL[0:4], DWL0 to DWL3, WL0 to WL31, PG, and DSL[0:4] of the selected memory block 10MB without a voltage drop, the block select circuit 330 should output a transmit block select signal Vsel_m having a level higher than the operating voltage to the connect circuit 320. For example, in a period in which the operating voltage application circuit 310 outputs the operating voltages including the program voltage to the global lines GSSL[0:4], GDWL0 to GDWL3, GWL0 to GWL31, GPG, and GDSL[0:4], the block select circuit 330 may preferably output the block select signal Vsel_m having a level higher than at least the program voltage by the threshold voltage of the transistor NT.

Figure 6:
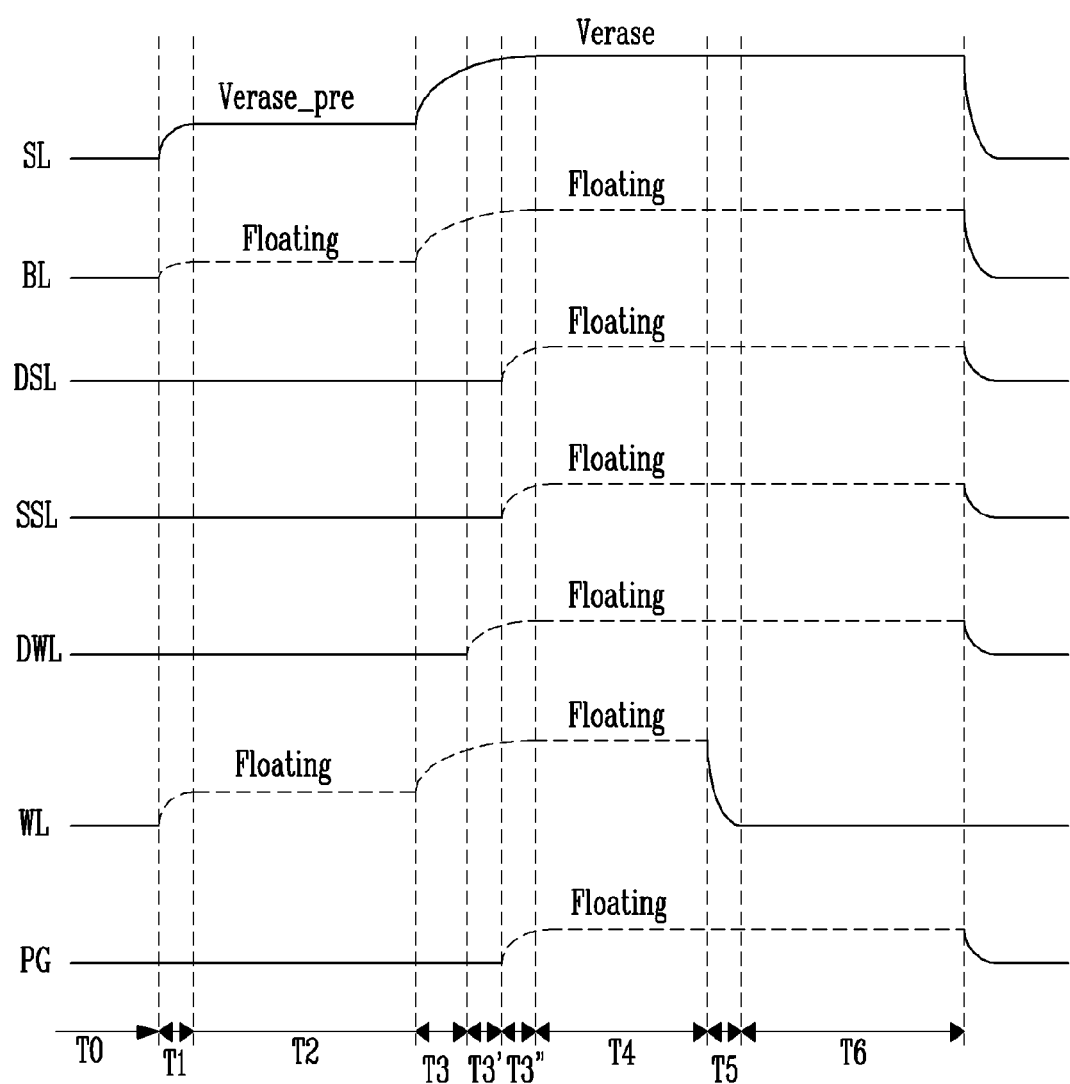
FIG. 6 is a waveform diagram illustrating a representation of a method of operating a semiconductor device according to an embodiment.

FIG. 6 is a waveform diagram illustrating a representation of a method of operating a semiconductor device according to an embodiment.

Referring to FIGS. 2B, 5, and 6, the operation circuit (for example, 30) is configured to apply the source voltage to the common source line SL for the erase operation of the memory cells, and control floating states of the select lines DSL and SSL and the word lines WL. When the operation circuit 30 further includes the dummy memory cells DC0 to DC3 and the pipe transistor PT, the operation circuit 30 may also control floating states of the dummy word lines DWL0 to DWL3 and the pipe gate line PG.

In particular, the operation circuit 30 increases the source voltage from a ground level to the precharge level Verase_pre, and then, increases the source voltage from the precharge level Verase_pre to the erase level Verase. Also, the operation circuit 30 may be preferably configured to set the select lines DSL and SSL to a floating state after starting to increase the source voltage from the precharge level Verase_pre to the erase level Verase. In addition, the operation circuit 30 is configured to set the pipe gate line PG to a floating state after starting to increase the source voltage from the precharge level Verase_pre into the erase level Verase. The operation circuit 30 is configured to set the dummy word lines DWL to a floating state after starting to increase the erase voltage from the precharge level Verase_pre, and set the dummy word lines DWL to a floating state before the select lines DSL and SSL are set to a floating state.

The operation circuit 30 is configured to set the bit line BL to a floating state when the source voltage starts to increase toward the precharge level Verase_pre.

The operation circuit 30 is configured to set the word lines WL to a floating state, when the source voltage starts to increase from the ground level toward the precharge level Verase_pre. Also, the operation circuit 30 is configured to increase the source voltage from the precharge level Verase_pre to the erase level Verase, after setting the word lines WL to a floating state. The operation circuit 30 is configured to apply the ground voltage to the word lines WL after increasing the erase voltage to the erase level Verase. The operation circuit 30 is configured to apply the ground voltage to word lines WL after floating the select lines DSL and SSL. Also, the operation circuit 30 is configured to set the select lines DSL and SSL to a floating state after setting the word lines WL to a floating state.

The operation circuit 30 controls floating states of the dummy word lines DWL and the word lines WL so that voltages of the dummy word lines DWL are more boosted than voltages of the select lines DSL and SSL by the source voltage. The operation circuit 30 controls floating states of the word lines WL and the dummy word lines DWL so that voltages of the word lines WL are more boosted than voltages of the dummy word lines DWL by the source voltage. The operation circuit 30 controls floating states of the select lines DSL and SSL and the word lines WL so that voltages of the word lines WL are more boosted than voltages of the select lines DSL and SSL by the source voltage.

Hereinafter, potential states of the local lines SSL, DWL, WL, PG, and DSL will be explained in a time sequence.

In a standby period (or an initial period) T0, voltages of the common source line SL, the local lines SSL, DWL, WL, PG, and DSL, and the bit line BL maintain a ground level.

In a first period T1, the operation circuit 30 sets the bit lines BL and the word lines WL to a floating state, and starts to increase a voltage of the source line SL from the ground level. Both voltages of the bit line BL and the word lines WL, which are in a floating state, increase by a capacitor coupling phenomenon.

In a second period T2, a voltage of the common source line SL increases until the precharge level Verase_pre. Voltages of the word lines WL, which are in a floating state, also increase toward a similar level as the precharge level Verase_pre. Remaining lines DLS, SSL, PG, and DWL maintain the ground level.

In a third period T3, T3', and T3", the operation circuit 30 starts to increase a voltage of the common source line SL from the precharge level Verase_pre. Also, after increasing a voltage of the common source line SL from the precharge level Verase_pre, the operation circuit 30 may sequentially set the dummy word lines DWL, the select lines DSL and SSL, and the pipe gate line PG to floating states.

In particular, in a first section T3 of the third period, the operation circuit 30 additionally increases a voltage of the common source line SL from the precharge level Verase_pre. Thus, voltages of the bit line BL and the word lines WL may be additionally increased by a capacitor coupling phenomenon.

In a second section T3' of the third period, the operation circuit 30 may be set the dummy word lines DWL to a floating state. In the second section T3', since a voltage of the common source line SL continuously increases, voltages of the dummy word lines DWL, which are in a floating state, are also increased based on the common source line SL by the capacitor coupling phenomenon.

In a third section T3" of the third period, the operation circuit 30 may set the select lines DSL and SSL and the pipe gate line PG to a floating state. In the third section T3", since a voltage of the common source line SL continuously increases, voltages of the select lines DSL and SSL and the pipe gate line PG, which are in floating states, are also increased based on the voltage of the common source line SL by the capacitor coupling phenomenon.

In a fourth period T4, a voltage of the common source line SL increases toward the erase level Verase. When the voltage of the common source line SL increases toward the erase level Verase, holes are supplied to a vertical channel layer, and thus, the voltage of the vertical channel layer, which serves as a bulk of the memory cells C0 to C31, is increased until the erase level Verase. The increase of the local lines SSL, DWL, WL, PG, and DSL and the bit line BL, which are in a floating state, stops.

The word lines WL are firstly set to a floating state during the first period T1. The dummy word lines DWL are set to a floating state during the second section T3' of the third period. The select lines DSL and SSL and the pipe gate line PG are set to a floating state during the third section T3" of the third period. Thus, the voltages of the word lines WL which are firstly set to a floating state and increase toward the highest level, and the voltages of the select lines DSL and SSL and the pipe gate line PG, which are lastly set to a floating state, increase toward the lowest level.

In a fifth period T5, the operation circuit 30 applies the ground voltage to the word lines WL. Thus, the voltages of the word lines WL decrease toward the ground level.

In a sixth period T6, the erase operation of the memory cells C0 to C31 proceeds by a voltage difference between the word lines WL of the ground level and the vertical channel layer of the erase level Verase. Since the voltages of the remaining the local lines DSL, SSL, DWL, and PG are increased by the capacitor coupling phenomenon and the voltage difference with the vertical channel layer is small, the erase operation of the dummy memory cells DC0 to DC3 and the select transistors DST and SST is not performed.

As described above, by adjusting the floating timing of the dummy word lines DWL, the select lines DSL and SSL, and the pipe gate line PG, the voltage increase of the select lines DSL and SSL may be controlled, and thus, an abnormal variation of a threshold voltage may be suppressed.

Figure 7:
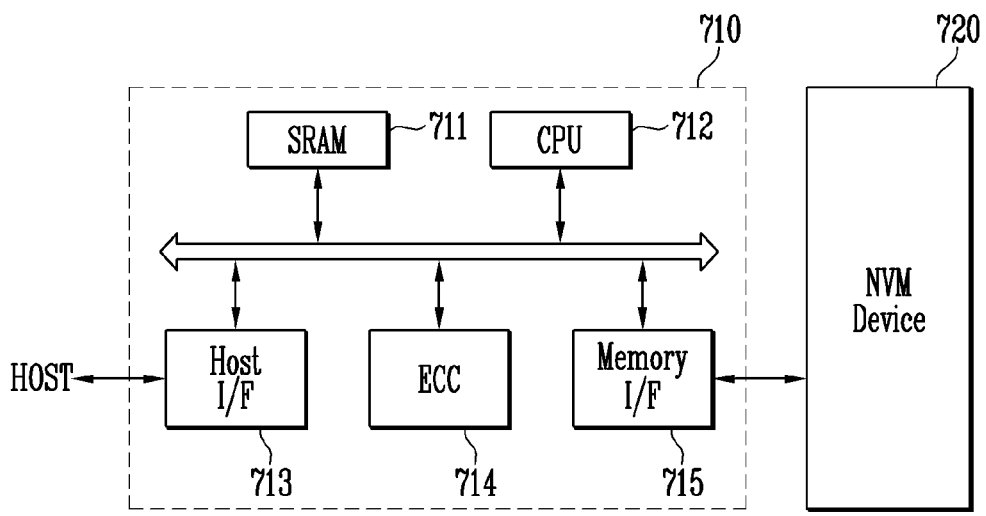
FIG. 7 is a block diagram illustrating a representation of a memory system according to an embodiment.

FIG. 7 is a block diagram illustrating a representation of a memory system according to an embodiment.

Referring to FIG. 7, a memory system 700 according to an embodiment may include a nonvolatile memory (NVM) device 720 and a memory controller 710.

The NVM device 720 may correspond to the semiconductor device illustrated in FIGS. 1 to 6. The memory controller 710 may be configured to control the NVM device 720. The NVM device 720 may be combined with the memory controller 710, and used for a memory card or a semiconductor disk device such as a solid state disk (SSD). An SRAM 711 is used as an operational memory of a central processing unit (CPU) 712. A host interface 713 includes a data exchange protocol of a host Host coupled to the memory system 700. An error correcting block (ECC) 714 detects and corrects an error in the data read from a cell area of the NVM device 720. A memory interface 715 interfaces with the NVM device 720. The CPU 712 performs overall control operations for exchange data of the memory controller 710.

Although not illustrated in FIG. 7, a person skilled in the art may understand that the memory system 700 according to the embodiments may further include a ROM (not illustrated) configured to store code data for interfacing with the host Host, and/or the like. The NVM device 720 may be provided as a multi-chip package having a plurality of flash memory chips. The memory system 700 according to the embodiments may be provided to a highly reliable storage medium having improved operation characteristics. In particular, the flash memory device according to the embodiments may be included in a memory system such as a semiconductor disk device (an SSD). In these examples, the memory controller 710 may be configured to communicate with the outside (for example, the host Host) through at least one of various interface protocols such as a USB, a MMC, a PCI-E, a SATA, a PATA, an SCSI, an ESDI, an IDE, etc.

Figure 8:
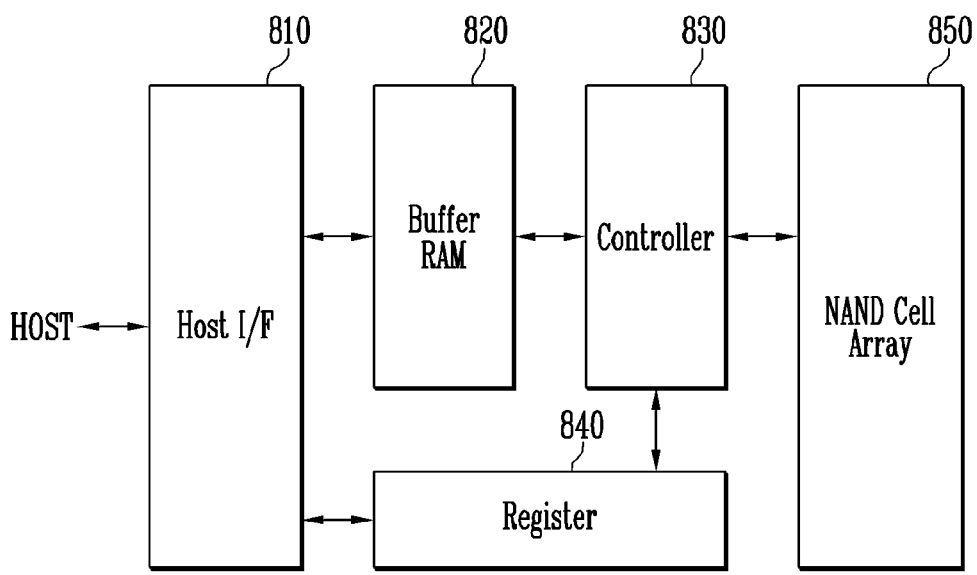
FIG. 8 is a block diagram illustrating a representation of a fusion memory device or a fusion memory system configured to perform a program operation according to the above-mentioned embodiments.

FIG. 8 is a block diagram illustrating a representation of a fusion memory device or a fusion memory system configured to perform a program operation according to the above-mentioned embodiments. For example, technical characteristics of the various embodiments discussed above with regards to FIGS. 1-6 may be applied to an OneNAND flash memory device 800 as a fusion memory device.

The OneNAND flash memory device 800 may include a host interface 810 configured to exchange overall information with devices using different protocols, a buffer RAM 820 including a code configured to drive the memory device or temporarily store data. The OneNAND flash memory device 800 may include a controller 830 configured to control a read operation, a program operation, and all states in response to a control signal and a command provided from the outside. The OneNAND flash memory device 800 may include a register 840 configured to store data such as the command, and an address, a configuration for defining a system operation environment inside the memory device, and/or the like. The OneNAND flash memory device 800 may include a NAND flash cell array 850 including an operation circuit including a nonvolatile memory cell and a page buffer. The OneNAND flash memory device 800 may program data in a general method in response to a write request from the host Host.

Figure 9:
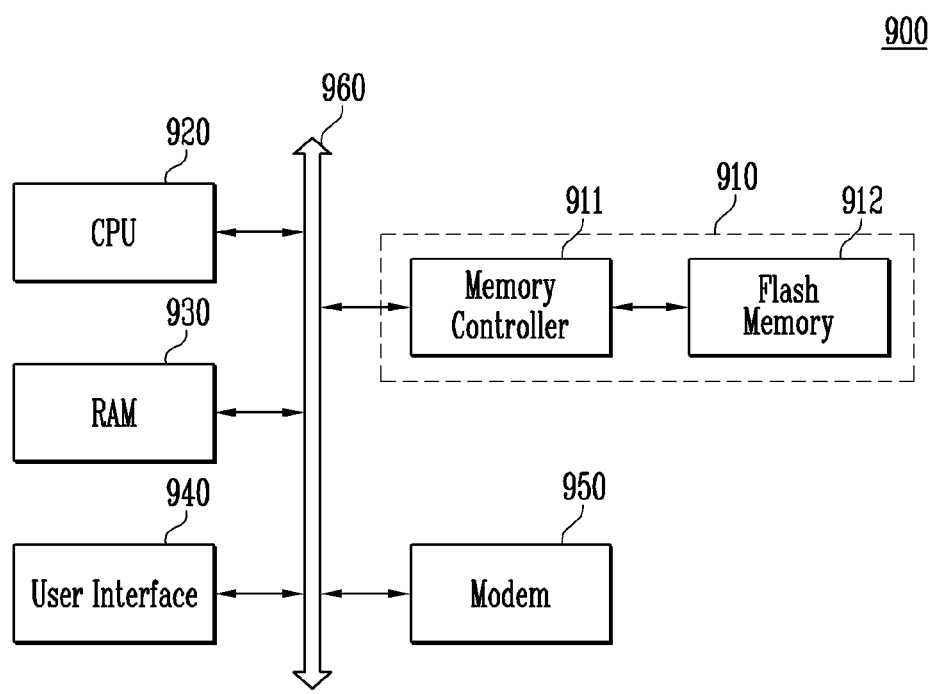
FIG. 9 is a block diagram illustrating a representation of a computing system including a flash memory device according to an embodiment.

FIG. 9 is a block diagram illustrating a representation of a computing system including a flash memory device 912 according to an embodiment.

The computing system 900 according to the embodiments may include a CPU 920, a RAM 930, a user interface 940, a modem 950 such as a baseband chipset, and a memory system 910, which are electrically connected to a system bus 960. When the computing system 900 is a mobile device, a battery (not illustrated) configured to supply an operating voltage to the computing system 900 may be additionally provided. Although not illustrated in FIG. 9, a person skilled in the art will understand that, in the computing system 900 according to the embodiments, an application chipset, a camera image processor (CIS), a mobile DRAM, and/or the like may be further provided. The memory system 910, for example, may be included in a solid state drive/disk (SSD) using the nonvolatile memory device described in FIGS. 1 to 6 so as to store data, or the memory system 910 may be provided to a fusion flash memory (for example, the OneNAND flash memory).

The semiconductor device according to the various embodiments may minimize the variation of the threshold voltage caused by an increase of the voltages of the select lines by a capacitor coupling phenomenon, and thus, reliability may be improved.

It will be apparent to those skilled in the art that various modifications can be made to the above-described examples of embodiments without departing from the spirit or scope of the application.

What is claimed is:

1. A semiconductor device comprising:
    a memory block including a memory string electrically coupled between a bit line and a common source line, the memory string including source select transistors and memory cells configured to operate in response to operating voltages applied to select lines and word lines coupled to the memory cells and the source select transistors; and
    an operation circuit applying a source voltage to the common source line for an erase operation, and to control floating states of the select lines and the word lines,
    wherein the operation circuit setting the select lines to a floating state after the source voltage starts to increase from a precharge level to an erase level.

2. The semiconductor device of claim 1, wherein the operation circuit is configured to increase the source voltage from a ground level to the precharge level.

3. The semiconductor device of claim 2, wherein the operation circuit is configured to increase the source voltage from the precharge level to the erase level.

4. The semiconductor device of claim 3, wherein the operation circuit is configured to set the bit line to a floating state when the source voltage starts to increase to the precharge level.

5. The semiconductor device of claim 3, wherein the operation circuit is configured to set the word lines to a floating state when the source voltage starts to increase from the ground level to the precharge level.

6. The semiconductor device of claim 1, wherein the operation circuit is configured to increase the source voltage from the precharge level to the erase level after setting the word lines to a floating state.

7. The semiconductor device of claim 6, wherein the operation circuit is configured to apply a ground voltage to the word lines after increasing an erase voltage to the erase level.

8. The semiconductor device of claim 7, wherein the operation circuit is configured to apply the ground voltage to the word lines after floating the select lines.

9. The semiconductor device of claim 1, wherein the operation circuit is configured to set the select lines to a floating state after setting the word lines to a floating state.

10. The semiconductor device of claim 1, further comprising a pipe transistor formed between the memory cells and configured to operate based on an operating voltage applied to a pipe gate line, the pipe gate coupled to the pipe transistor.

11. The semiconductor device of claim 10, wherein the operation circuit is configured to set the pipe gate line to a floating state after increasing the source voltage from the precharge level to the erase level.

12. The semiconductor device of claim 1, further comprising a dummy word line interposed between the select line and the word line.

13. The semiconductor device of claim 12, wherein the operation circuit is configured to set the dummy word lines to a floating state after an erase voltage starts to increase from the precharge level.

14. The semiconductor device of claim 13, wherein the operation circuit is configured to set the dummy word lines to a floating state before setting the select lines to a floating state.

15. The semiconductor device of claim 12, wherein the operation circuit is configured to control floating states of the dummy word lines and the word lines with the source voltage to boost voltages of the dummy word lines more than voltages of the select lines.

16. The semiconductor device of claim 12, wherein the operation circuit is configured to control floating states of the word lines and the dummy word lines with the source voltage to boost voltages of the word lines more than voltages of the dummy word lines.

17. The semiconductor device of claim 1, wherein the operation circuit is configured to control floating states of the select lines and the word lines with the source voltage to boost voltages of the word lines more than voltages of the select lines.

18. A computing system including a central processing unit, an interface, and a memory system coupled with one another through a bus,
    wherein the memory system includes a memory controller coupled to a flash memory, the flash memory comprising:
    a memory string electrically coupled between a bit line and a common source line, the memory string including source select transistors and memory cells configured to operate in response to operating voltages applied to select lines and word lines coupled to the memory cells and the source select transistors; and
    an operation circuit applying a source voltage to the common source line for an erase operation, and to control floating states of the select lines and the word lines,
    wherein the operation circuit setting the select lines to a floating state after the source voltage starts to increase from a precharge level to an erase level.

* * * * *

UNITED STATES PATENT AND TRADEMARK OFFICE
CERTIFICATE OF CORRECTION

| | | |
|---|---|---|
| PATENT NO. | : 9,490,021 B2 | Page 1 of 1 |
| APPLICATION NO. | : 14/620493 | |
| DATED | : November 8, 2016 | |
| INVENTOR(S) | : Jae Wook Yang | |

It is certified that error appears in the above-identified patent and that said Letters Patent is hereby corrected as shown below:

On the Title Page

Item (30) Foreign Application Priority Data
Add "Oct. 14, 2014    (KR) ................................. 10-2014-0138345"

Signed and Sealed this
Fourteenth Day of March, 2017

Michelle K. Lee
*Director of the United States Patent and Trademark Office*